United States Patent [19]

Sussman

[11] Patent Number: 5,119,331
[45] Date of Patent: Jun. 2, 1992

[54] SEGMENTED FLASH WRITE

[75] Inventor: Howard H. Sussman, Acton, Mass.

[73] Assignee: NEC Electronics Inc., Mt. View, Calif.

[21] Appl. No.: 576,745

[22] Filed: Sep. 4, 1990

[51] Int. Cl.[5] .......................... G11C 7/00; G11C 8/00
[52] U.S. Cl. .......................... 365/189.01; 365/230.01
[58] Field of Search .................. 365/189.01, 230.01, 365/230.05

[56] References Cited

U.S. PATENT DOCUMENTS 4,879,692  11/1989  Tokushige ............... 365/189.01 X
5,003,510  3/1991  Kamisaki ............... 365/189.01

Primary Examiner—Joseph A. Popek
Attorney, Agent, or Firm—Skjerven, Morrill, MacPherson, Franklin & Friel

[57] ABSTRACT

A method in which a variable sized segment of a memory array can be written in a single memory cycle is provided. A predetermined set of the column addresses or a combination of the column address and I/O field specify the starting location of a block of a memory array row to be written. The set of remaining column addresses specifies displacement from the starting location. Together the starting segment and the displacement define an area of memory which can be written in a single cycle.

4 Claims, 3 Drawing Sheets

SEGMENTED FLASH WRITE

FIELD OF THE INVENTION

This invention relates to a method of quickly and efficiently writing a block of data to a memory array.

BACKGROUND OF THE INVENTION

In raster displays, the objects displayed on the screen of a cathode ray tube (CRT) are made up of picture elements or pixels. The raster is simply a matrix of pixels covering the entire screen. A set of horizontal raster lines made up of individual pixels forms the image which is scanned out sequentially one raster line at a time. The information needed to form the image is stored in a bit map containing at least one bit for each pixel.

The bit map is made up of a dynamic random access memory (DRAM) array having numerous cells which can each contain one bit of information. Each DRAM cell can be addressed by the proper selection of its row and column location. When the bit map is used to control the screen image of a CRT in a simple graphics display each DRAM cell determines the state, either on or off, of one pixel. A high resolution CRT may have, for example, a width of 1024 and a length of 768 pixels.

FIG. 1 depicts a display screen 20 having five rows and ten columns of pixels which display a trapezoid 22. Of course, a standard high definition screen may have 1024×768 pixels. The first line 24 of trapezoid 22 consists of filled or "on" pixels in columns 4, 5 and 6 of row 2. Array 30 of FIG. 2 depicts the data that would be stored in a bit map which controls the display screen 20 in FIG. 1. The bit map which holds the data shown in FIG. 2 has 10 columns and 5 rows of DRAM cells which each hold one bit of data, either a 1 or a 0. Each DRAM cell of such a bit map corresponds to 1 pixel of screen 20 so that a 1 bit stored in a DRAM cell causes the appropriate pixel to be on or filled and a 0 bit causes the appropriate pixel to be off or cleared. For instance, in a bit map, the DRAM cells which contain the data shown in array 30 hold a 1 in columns 4, 5 and 6 of row 2, causing pixels 4, 5 and 6 in row 2 of screen display 20 to be on. To clear or erase the first line 24 of trapezoid 20, the 1 bits in row 2 of array 30 must be set to 0.

When a graphics program operator desires to fill or clear some portion of the screen, such as the first row 24 of trapezoid 20, a prior art method of doing so performs a memory operation for each pixel being changed. Each cell of the bit map corresponding to the appropriate pixel must be individually addressed and the appropriate data, 1 or 0, written into that cell. For instance, to clear first line 24 of trapezoid 22, three memory operations would be required, but to clear one horizontal line of a high resolution CRT screen 1024 memory operations would be required. This method of clearing a screen portion is unsatisfactorily slow.

In 1986, at the IEEE International Solid-State Circuits Conference, Whitesides et al. presented the method "Flash Write" which is capable of improving the speed for clearing a screen in certain circumstances. "Flash Write" addresses an entire row of the bit map corresponding to an entire line of pixels and writes the same data to each cell of the bit in single cycle. "Flash Write" allows clearing of an entire screen of pixels in 1/1024 the amount of time required for the prior art method described above (for a screen 1024 pixels wide). However, "Flash Write" encompasses a major drawback in that only an entire line of the screen may be cleared in this manner. Segments of the line must be cleared by erasing each pixels individually, necessitating addressing each bit map cell. For example, "Flash Write" could not be used to generate polygon 32 of FIG. 3 from trapezoid 22 by clearing columns 3 and 4 of row 3 and columns 2, 3 and 4 of row 4 of screen 20 and array 30.

Texas Instruments developed another improvement for clearing screen portions called "4×4 Block Write" as part of the TMS44C251 multiport Video RAM. The rows of the device each have four bit words enabling 4 bits to be addressed with each memory cycle. Because each bit still corresponds to one pixel, clearing a line segment can be accomplished in ¼ the number cycles required to clear the same segment by addressing one cell at a time. "Block Write" also allows four bits of data present in an on-chip color data register to be written to any combination of four adjacent column address locations. By addressing four column locations at once and a row containing four bit words, 16 bits of data can be written to the bit map memory during one memory cycle, corresponding to clearing or filling a 16 pixel block of the screen. "Block Write" and four bit words have the disadvantage, however, that numerous memory cycles are still required to clear or fill a large portion of the screen, thereby significantly slowing the procedure.

The TI device and other prior art memories are also equipped with a write mask register which provides a persistent write per bit mode without repeated mask loading. The mask register contains one bit for each pixel in one line of the screen and one row of the bit map. A single mask register can be used for multiple rows of the bit map and each row is acted upon independently. In order to clear a line segment the column input data for the mask register will be chosen so that when the mask register is ANDed with the row of interest, the appropriate cells of the bit map will be set to zero so that the corresponding pixels will be cleared. When the portion of the screen to be cleared or filled is a rectangle, the first and last pixel of the rectangle will be the same for each line of the screen and, therefore, the mask register will be the same for each row of the bit map. By repeatedly using the same mask register, a rectangle can be cleared substantially faster as compared to the method in which each bit is individually addressed. When the rectangle is completely cleared, the mask is simply disabled.

Defining a mask register requires individual serial input for each bit of the mask. If the screen portion to be cleared or filled is not a rectangle but rather an irregularly shaped polygon, the first and last pixels of the polygon may be different in each line. In this case the mask register must be updated before being ANDed with each row of the bit map, requiring the same number of memory cycles as bits in each row, in many cases 1024, significantly lengthening the time needed to clear or fill the irregular polygon.

In 1984, NEC, as part of industry and customer presentations of advanced graphics described a video memory with multiple serial registers that included a mode for writing to whole segments of the bit map memory in a single memory cycle. In this mode, a bit map row is divided into 8 equal length segments, each segment being directly mapped from the column address field. When a segment is addressed, the entire segment can be written to in one cycle, requiring only eight cycles to write an entire row of the bit map and to clear or fill a whole line of pixels. However, because each bit of a segment will contain the same data when the entire segment is written at one time, bits corresponding to pixels to be cleared or filled which lie outside an integral number of segments must be addressed and changed individually. The one eighth row length of the segments is too coarse to be optimal for most applications. As the more desirable single bit resolution requires a unique clock cycle or operation to set the mask register for each data bit is undesirably slow, neither concept was implemented in a product.

The question presented by the prior art then is how to clear or fill an irregularly shaped object displayed on a CRT screen as quickly as possible.

SUMMARY OF THE INVENTION

It is often desirable to write a block of memory rapidly and with the desired resolution. The present invention provides the ability to perform this operation on a variable sized segment of memory with a single memory cycle. According to one embodiment of this invention, a row of the bit map is divided into a number of segments. A predetermined set of the column addresses or a combination of the column addresses and the I/O field define the starting segment of a portion of the row to be written. The set of remaining column addresses specifies a displacement from the starting segment. Together the starting segment and the displacement define a portion of the bit map row, an area of memory, which can be written in a single cycle. In this way only one memory cycle is necessary to clear or fill each line of an irregularly shaped object on a CRT screen, facilitating a very rapid operation.

DETAILED DESCRIPTION OF THE INVENTION

The method of this invention can be used with known semiconductor devices such as the μPD42274 Dual-Port Graphic Buffer made by NEC Electronics, Inc.

Figure 1:
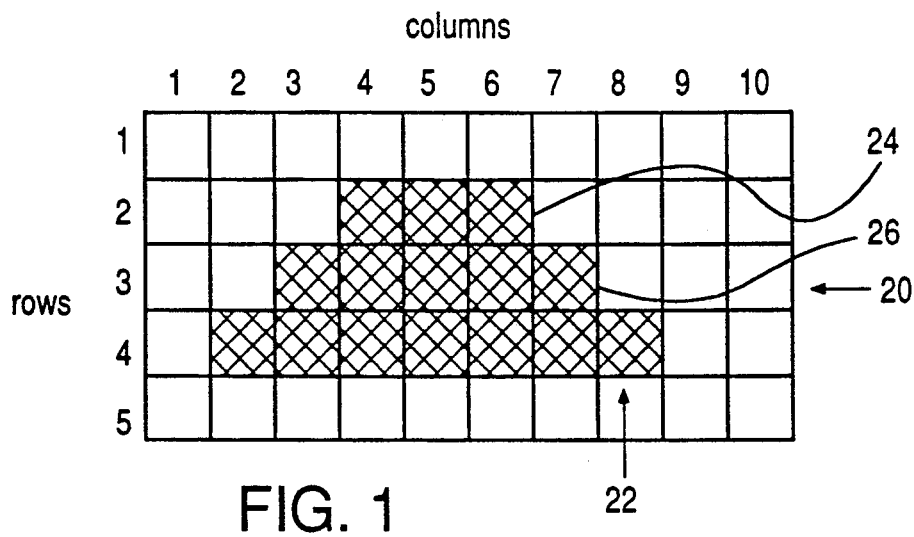
FIG. 1 illustrates a screen of a CRT having five rows and ten columns of pixels displaying a trapezoid.
Figure 2:
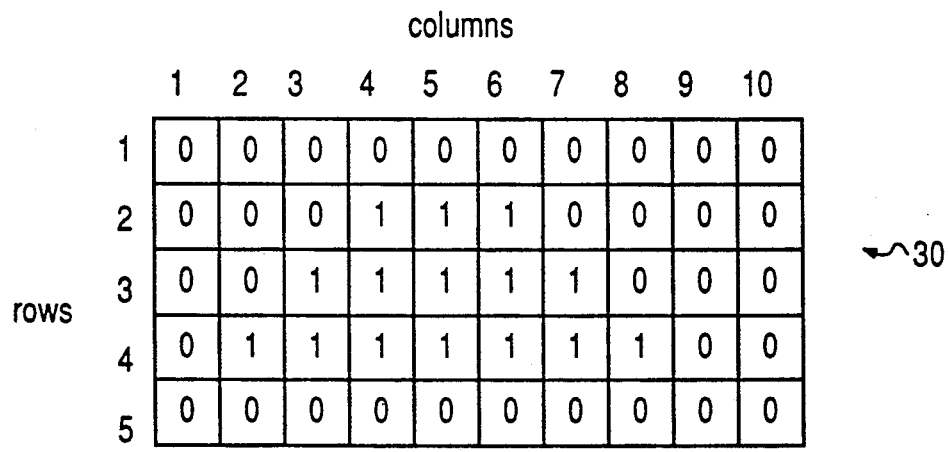
FIG. 2 illustrates the data which would be stored in a bit map for controlling the display of the screen in FIG. 1.
Figure 3:
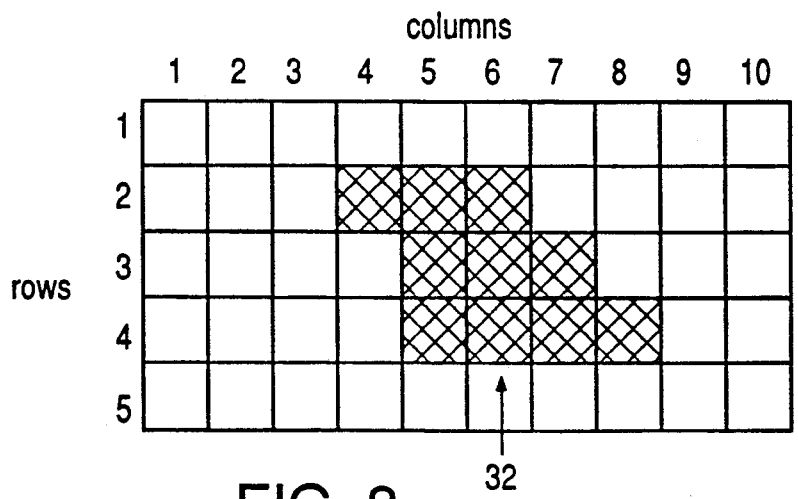
FIG. 3 illustrates a screen of a CRT displaying an irregularly shaped polygon.
Figure 4:
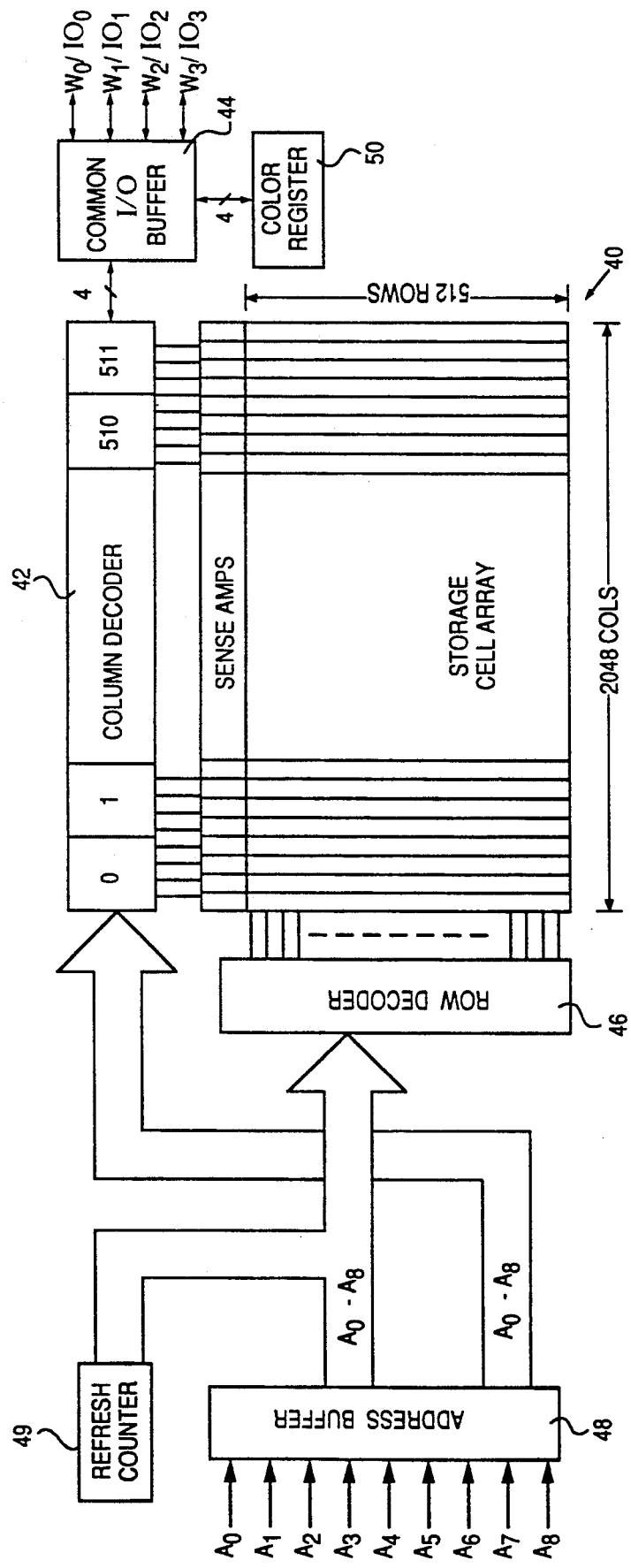
FIG. 4 is a block diagram of components of a memory device which can be used according to the methods of this invention.

For the purposes of illustration, the present invention is described for use with a memory device such as the memory device μPD42274, selected components of which are shown in FIG. 4. Storage cell array 40 is arranged in a 512 row by 2048 column matrix which makes up the bit map. Each row contains 512 storage cells each containing four one bit cells and, therefore each holding four bits. Consequently, through 1 of 512 column decoders 42, four bit cells (one storage cell) on each row are connected to four data buses for which data is entered on lines $IO_0$–$IO_3$ through common I/O buffer 44. Row decoder 46 requires nine row address bits to select one of the 512 rows. Column decoder 44 requires nine column address bits to select one of the 512 column locations which are groups of columns having four bits each. The address bits are set up on pins $A_0$–$A_8$ which are multiplexed as row address inputs and column address inputs. A memory device such as μPD42274 will include many components not shown in FIG. 4 such as transfer gates, a data register, a serial output buffer and a timing generator. Components shown but not described, address buffer 48, refresh counter 49, and color register 50, are used in a standard manner.

Figure 5:
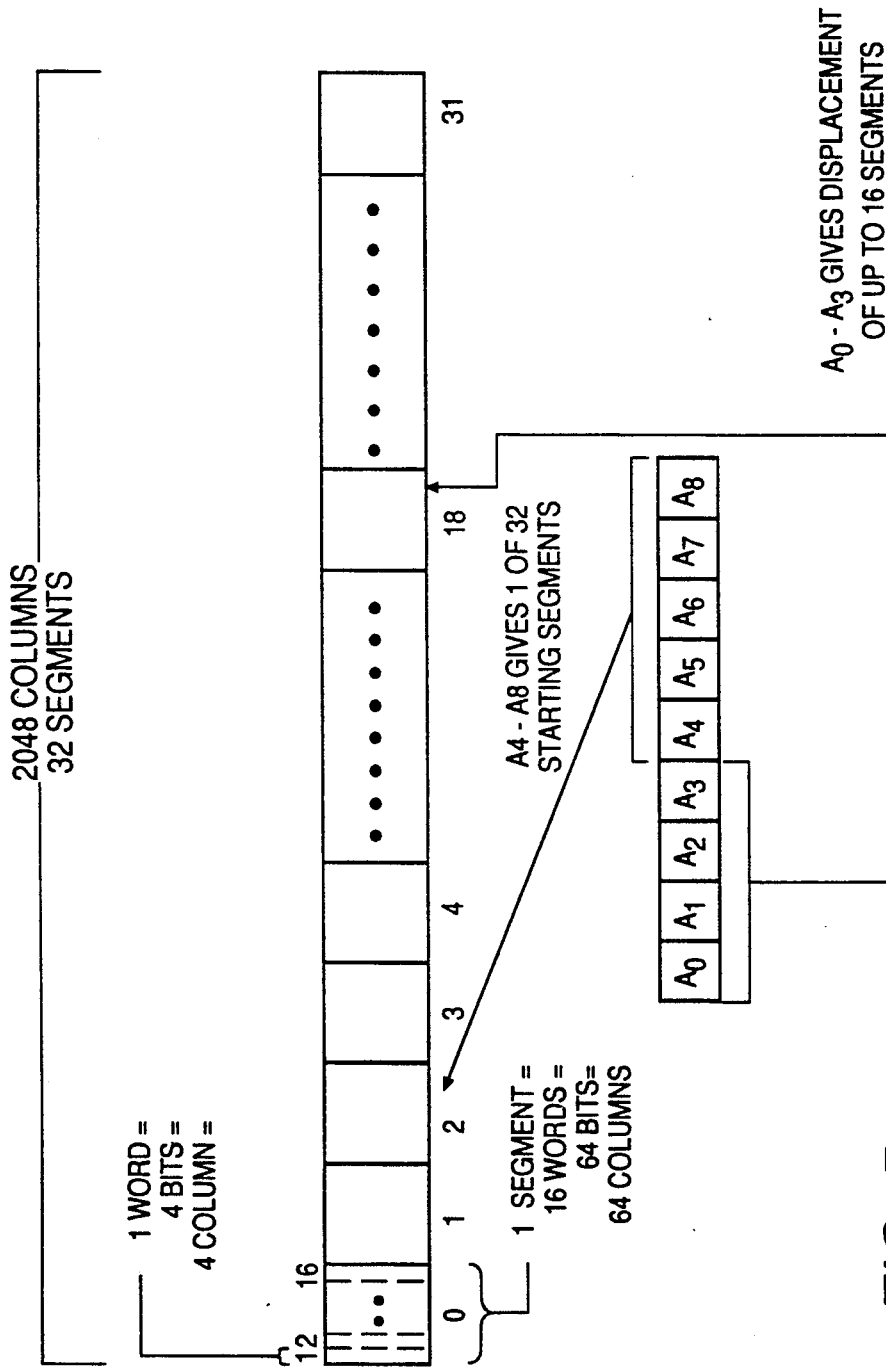
FIG. 5 is a schematic illustration of a row of a memory array which can be written to according to this invention.

FIG. 5 schematically illustrates one row of the memory array described above. The row contains 2048 columns holding a total of 2048 bits which are organized in 512 four bit words so that the columns can be addressed by the column decoder at 512 positions. If only the five most significant column addresses, $A_4$–$A_8$ are used to designate a group of columns, the row is effectively divided into 32 segments, each containing 64 bits or 16 words, because the row can be addressed at only 32 different locations. According to one embodiment of this invention, the column addresses $A_4$–$A_8$ are used to specify the starting location of a block to be written as one of the 32 segments. The remaining four least significant column address bits, $A_0$–$A_3$ are used to specify a displacement along the row. Four address bits can specify a displacement of up to 16 segments, or one-half the row.

When a block is defined by a starting segment and displacement, data, either all 1's or all 0's, or a pattern of data under control of mask registers can be entered into all bit cells of the block in one memory cycle in a well-known manner. If the memory array controls a CRT screen the data change causes either clearing or filling of the corresponding block of pixels. Clearing an entire row of pixels by writing an entire bit map row using this embodiment of the present invention would require two memory cycles with a different starting location designated for each cycle because the total displacement which can be specified is only one-half the row.

Obviously, portions of the CRT screen to be cleared and, therefore, blocks of a bit map row to be written may not contain an integral number of segments. In this case, the storage cells lying outside of an integral number of segments can be individually addressed to enter the appropriate data. Alternatively, those storage cells may be ANDed with an appropriately set mask register.

The method of this invention can be used to provide better resolution of the area to be written, but a smaller total area that is accessible in each memory cycle. For instance, if the six most significant addresses $A_3$–$A_8$ are used to specify the starting segment, the row will be divided into 64 segments of 32 bits each giving 64 possible starting locations. By providing more and smaller segments the starting location of the pixel line to be cleared or filled will be more accurately designated so that less cells of the bit map will need to be individually addressed and changed to completely clear or fill the desired line of pixels. However, only three addresses $A_0$–$A_2$ will be available for specifying only up to eight segments for displacement. In this embodiment a maximum one-eighth block of a row can be written at one time. This embodiment may be preferable when small blocks are usually cleared or filled on a screen and improved resolution is desirable.

In another embodiment of this invention, the I/O lines may be combined with the column addresses to provide more bits for specifying starting segments. By using more bits, more and smaller segments of the row define the block of the bit map row to be written. Alternatively, the I/O lines may be used to specify the total segment displacement. Using the four data I/O lines of the memory device described above for signifying a displacement of up to 16 segments leaves all nine address pins $A_0$-$A_8$ for indicating any one of the 512 four bit words of a row as the starting segment, giving the maximum resolution possible with this system. Different combinations of I/O lines and column addresses give a variety of segment sizes and displacement lengths. Although a majority of the memories made for video systems are able to use the I/O lines in this manner, it will not be advantageous to do so in every video system.

In general, increased resolution will be preferred over clearing or filling a large block of pixels in one memory cycle as long as a block at least a quarter of the screen wide can be cleared in one cycle. Objects to be cleared on a CRT screen often occupy less than a quarter of CRT screen and, thus, increasing segment size in order to increase total possible displacement length becomes disadvantageous once the possible displacement is more than one-quarter the width of the screen. In many cases, the "Flash Write" feature of the prior art can be enabled on a device which can also operate according to this invention to clear or fill an entire line of pixels when necessary.

The decision as to how many column addresses and I/O lines to allocate to designating the starting segment and how many to allocate to designating the segment displacement is determined in the design of the memory device and ordinarily cannot be altered by the user. The embodiments of the invention described above can be implemented by using either a combination of existing control pins or a previously non-connected pin of a memory device to supply another enable line for activating the column decoder to operate according to this invention.

The present invention has been explained in relation to clearing or filling an object displayed on a CRT screen. However, it should be understood that the inventive concept of the invention can be applied to the manipulation of data in a memory array whether or not that memory controls a CRT display. For instance, "Segmented Flash Write" can be used to write a vector to memory by giving the starting point and the displacement of the vector.

I claim:

1. A method for writing a block of data bits to a line of a memory array, said memory array having a plurality of lines for storing data bits, each line having a plurality of addresses associated therewith, said method comprising the steps of:

providing a first subset of addresses for designating a starting location of said line;

providing a second subset of addresses for designating a displacement along said line;

enabling said first subset of addresses and said second subset of addresses to designate a portion of said line; and writing a plurality of data bits to said portion of said line, each data bit being identical.

2. A method for writing a block of data bits to a row of a memory array on a memory device, said memory array having a plurality of rows for storing data bits, said memory array also having a plurality of column locations, each column location having a plurality of addresses associated therewith, said memory device having a plurality of data lines operatively connected to said column locations, said method comprising the steps of:

providing a first subset of addresses for designating a starting location of said row;

providing a second subset of addresses for designating a displacement along said row;

enabling said first subset of addresses and said second subset of addresses to designate a portion of said row; and writing a plurality of data bits from said data lines to said portion of said row, each data bit being identical.

3. The method according to claim 2 wherein said data lines are combined with said first subset of addresses for designating a starting location of said row.

4. The method according to claim 2 wherein said data lines are combined with said second subset of addresses for designating a displacement along said row.

* * * * *